(12) United States Patent
Takaku et al.

(10) Patent No.: US 11,560,513 B2
(45) Date of Patent: Jan. 24, 2023

(54) OPTICAL WAVELENGTH CONVERSION MEMBER AND LIGHT-EMITTING DEVICE

(71) Applicant: NGK SPARK PLUG CO., LTD., Nagoya (JP)

(72) Inventors: Shohei Takaku, Nagoya (JP); Yusuke Katsu, Nagoya (JP); Tsuneyuki Ito, Nagoya (JP); Toshiaki Kurahashi, Nagoya (JP); Hideto Yamada, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 164 days.

(21) Appl. No.: 16/973,322

(22) PCT Filed: Jul. 1, 2019

(86) PCT No.: PCT/JP2019/026188
§ 371 (c)(1),
(2) Date: Dec. 8, 2020

(87) PCT Pub. No.: WO2020/013016
PCT Pub. Date: Jan. 16, 2020

(65) Prior Publication Data
US 2021/0246367 A1 Aug. 12, 2021

(30) Foreign Application Priority Data
Jul. 11, 2018 (JP) .............................. JP2018-131544

(51) Int. Cl.
*C09K 11/02* (2006.01)
*F21V 9/30* (2018.01)
(Continued)

(52) U.S. Cl.
CPC ............ *C09K 11/02* (2013.01); *C04B 35/117* (2013.01); *C09K 11/7774* (2013.01); *F21V 9/30* (2018.02);
(Continued)

(58) Field of Classification Search
None
See application file for complete search history.

(56) References Cited

U.S. PATENT DOCUMENTS

| 2006/0124951 A1 | 6/2006 | Sakata et al. |
| 2013/0088143 A1 | 4/2013 | Ohtsubo et al. |

(Continued)

FOREIGN PATENT DOCUMENTS

| JP | 2014-132084 A | 7/2014 |
| JP | 2016-509103 A | 3/2016 |

(Continued)

OTHER PUBLICATIONS

Japan Patent Office, International Search Report issued in corresponding Application No. PCT/JP2019/026188, dated Sep. 10, 2019.

(Continued)

*Primary Examiner* — Vip Patel
(74) *Attorney, Agent, or Firm* — Stites & Harbison, PLLC; Jeffrey A. Haeberlin; Trevor T. Graves

(57) ABSTRACT

One aspect of the disclosure provides an optical wavelength conversion member including a polycrystalline ceramic sintered body containing, as main components, $Al_2O_3$ crystal grains and crystal grains represented by formula $(Y,A)_3B_5O_{12}$:Ce. In the optical wavelength conversion member, a $(Y,A)_3B_5O_{12}$:Ce crystal grain has a region wherein the A concentration of a peripheral portion of the $(Y,A)_3B_5O_{12}$:Ce crystal grain is higher than that of an interior portion of the $(Y,A)_3B_5O_{12}$:Ce crystal grain. Thus, (Continued)

the optical wavelength conversion member exhibits high fluorescence intensity (i.e., high emission intensity) and high heat resistance (i.e., low likelihood of temperature quenching). The optical wavelength conversion member has a structure wherein the element A concentration of a peripheral portion of a $(Y,A)_3B_5O_{12}$:Ce crystal grain differs from that in an interior portion of the crystal grain. This structure can achieve a ceramic fluorescent body exhibiting superior fluorescent characteristics and superior thermal characteristics with varied colors of emitted light.

4 Claims, 7 Drawing Sheets

(51) Int. Cl.
  *C04B 35/117* (2006.01)
  *C09K 11/77* (2006.01)
  *F21Y 115/30* (2016.01)

(52) U.S. Cl.
  CPC .................. *C04B 2235/3217* (2013.01); *C04B 2235/3222* (2013.01); *F21Y 2115/30* (2016.08)

(56) References Cited

U.S. PATENT DOCUMENTS

| | | |
|---|---|---|
| 2013/0256599 A1 | 10/2013 | Irie |
| 2015/0329778 A1 | 11/2015 | Menke et al. |
| 2017/0315433 A1 | 11/2017 | Ronda et al. |
| 2018/0026165 A1 | 1/2018 | Bechtel et al. |
| 2019/0198726 A1 | 6/2019 | Moteki et al. |
| 2019/0245118 A1 | 8/2019 | Moteki et al. |
| 2019/0245119 A1 | 8/2019 | Katsu et al. |
| 2019/0259918 A1 | 8/2019 | Shohei et al. |

FOREIGN PATENT DOCUMENTS

| | | |
|---|---|---|
| JP | 2017-536664 A | 12/2017 |
| JP | 2018-514895 A | 6/2018 |
| TW | 2018-21389 A | 6/2018 |
| WO | 2004-065324 A1 | 5/2006 |
| WO | 2011-125422 A1 | 10/2011 |
| WO | 2018-079421 A1 | 5/2018 |
| WO | 2018-079501 A1 | 5/2018 |

OTHER PUBLICATIONS

Taiwan Patent Office, Office Action (Notification for the Opinion of Examination) issued in corresponding Application No. TW108124333, dated Sep. 23, 2020.

OPTICAL WAVELENGTH CONVERSION MEMBER AND LIGHT-EMITTING DEVICE

CROSS-REFERENCE TO RELATED APPLICATIONS

This international application claims priority to Japanese Patent Application No. 2018-131544 filed in the Japan Patent Office on Jul. 11, 2018, the entire content of which is incorporated herein by reference.

TECHNICAL FIELD

The present disclosure relates to an optical wavelength conversion member and a light-emitting device, each of which can convert light wavelength and is used for, for example, wavelength conversion apparatuses, fluorescent materials, lighting apparatuses, and video apparatuses.

BACKGROUND ART

A head lamp, a projector, a lighting apparatus, or a similar apparatus generally includes a device for achieving white light through wavelength conversion, by means of a fluorescent body (i.e., a light wavelength conversion member), of blue light emitted from a light-emitting diode (LED) or a laser diode (LD).

Hitherto, the matrix or material of the fluorescent body (or a phosphor) has been, for example, a resin material or a glass material. In accordance with a trend for using a high-output light source in recent years, the phosphor is required to have higher durability. Thus, ceramic phosphors have received attention.

Known ceramic phosphors are formed of a Ce-activated garnet ($A_3B_5O_{12}$) component, such as $Y_3Al_5O_{12}$:Ce (YAG: Ce).

For example, Patent Documents 1 and 2 disclose a technique for forming an $Al_2O_3$-YAG:Ce composite material exhibiting improved heat resistance and thermal conductivity.

PRIOR ART DOCUMENTS

Patent Documents

Patent Document 1: Japanese Patent Application Laid-Open (kokai) No. 2014-132084
Patent Document 2: International Publication WO 2004/065324

SUMMARY OF THE INVENTION

Problem to be Solved by the Invention

The aforementioned conventional techniques may cause problems as described below, and the techniques require a further improvement.

In general, for adjusting the color of a phosphor, an element forming the crystal structure of a host material is substituted by another element, to thereby distort the crystal structure of the host material for achieving wavelength control.

For example, a known method involves substitution of the Y site of Ce-added $Y_3Al_5O_{12}$ (i.e., a phosphor having a garnet structure) by Gd ion, or substitution of the Al site of Ce-added $Y_3Al_5O_{12}$ by Ga ion. This method involves substitution of elements having different ionic radii, to thereby vary the coordination environment of light-emitting ions (Ce) serving as an activator of the phosphor for accomplishing wavelength control.

For example, Patent Document 1 discloses a method involving preparation of a phosphor using eutectic transformation of $Al_2O_3$ and YAG, and substitution of an element in YAG by Gd or Ga for achieving color adjustment.

Patent Document 2 discloses a technique involving preparation of an $Al_2O_3$-YAG composite phosphor, and substitution of an element in YAG by Gd for achieving color adjustment.

However, since such a method achieves wavelength control only through substitution of an element in YAG by Gd or Ga, the wavelength control may cause a reduction in the brightness (i.e., fluorescence intensity) of the phosphor, or impairment of thermal characteristics (i.e., high likelihood of temperature quenching).

The technique disclosed in Patent Document 2 causes precipitation of a $CeAl_{11}O_{18}$ phase (i.e., a third component) during production of a phosphor, possibly leading to a reduction in the thermal conductivity of the material itself (i.e., high likelihood of temperature quenching).

Thus, the aforementioned conventional techniques (i.e., a general method for color adjustment by, for example, Gd or Ga substitution) may cause a problem in that the characteristics of a phosphor (specifically, fluorescent characteristics (i.e., fluorescence intensity) and heat resistance (i.e., ability to suppress temperature quenching)) are considerably impaired.

One aspect of the present disclosure preferably provides an optical wavelength conversion member and a light-emitting device, each of which exhibits superior fluorescent characteristics and heat resistance.

Means for Solving the Problem (1) One aspect of the present disclosure is directed to an optical wavelength conversion member comprising a polycrystalline ceramic sintered body containing, as main components, $Al_2O_3$ crystal grains and crystal grains represented by formula $(Y,A)_3B_5O_{12}$:Ce.

In the optical wavelength conversion member, each of A and B of $(Y,A)_3B_5O_{12}$:Ce is at least one element selected from the following element groups:

A: lanthanoids (except for Ce) and Sc, and
B: Al and Ga; and
any of the $(Y,A)_3B_5O_{12}$:Ce crystal grains has a region wherein the A concentration of a peripheral portion of the $(Y,A)_3B_5O_{12}$:Ce crystal grain is higher than that of an interior portion of the $(Y,A)_3B_5O_{12}$:Ce crystal grain.

In the optical wavelength conversion member, as described above, the A concentration of a peripheral portion of the $(Y,A)_3B_5O_{12}$:Ce crystal grain is higher than that of an interior portion of the $(Y,A)_3B_5O_{12}$:Ce crystal grain. Thus, the optical wavelength conversion member exhibits high fluorescence intensity (i.e., high emission intensity) and high heat resistance (i.e., low likelihood of temperature quenching).

The aforementioned "A concentration" refers to an index for the amount of element A. For example, in the image analysis through STEM-EELS described below, the expression "the A concentration in a first measurement region is higher than that in a second measurement region having the same size as that of the first measurement region" refers to the case where the amount of element A in the first measurement region is greater than that in the second measurement region.

The principle residing in the optical wavelength conversion member will now be described.

In the optical wavelength conversion member (i.e., fluorescent body), emission at the periphery of a crystal grain greatly contributes to fluorescence intensity. Thus, even when, for example, the Gd ion concentration is relatively low in the interior of a crystal grain, the optical wavelength conversion member can sufficiently secure emission characteristics (e.g., fluorescent color and brightness). Meanwhile, when the ion concentration of, for example, Gd (which is added for color adjustment) is high, temperature quenching is likely to occur, resulting in impairment of heat resistance.

Thus, in the optical wavelength conversion member, the element A (added for color adjustment) concentration (i.e., ion concentration) is higher in a peripheral portion of a $(Y,A)_3B_5O_{12}$:Ce crystal grain, which emits fluorescence, than in an interior portion of the crystal grain.

Therefore, even when the element A concentration is low in an interior portion of a $(Y,A)_3B_5O_{12}$:Ce crystal grain, emission characteristics (e.g., fluorescent color and brightness) can be sufficiently secured; i.e., high fluorescence intensity is achieved. Since the element A concentration is low in an interior portion of a $(Y,A)_3B_5O_{12}$:Ce crystal grain, temperature quenching is less likely to occur, and thus heat resistance can be improved.

As described above, the optical wavelength conversion member has a structure wherein the element A concentration in a peripheral portion of a $(Y,A)_3B_5O_{12}$:Ce crystal grain differs from that in an interior portion of the crystal grain. This structure can achieve a ceramic fluorescent body (i.e., optical wavelength conversion member) exhibiting superior fluorescent characteristics (e.g., high emission intensity) and superior thermal characteristics (e.g., heat resistance regarding temperature quenching) with varying the color of light emitted from the optical wavelength conversion member.

In the optical wavelength conversion member, the ceramic sintered body has a garnet structure represented by $(Y,A)_3B_5O_{12}$:Ce, wherein each of A and B is at least one element selected from the aforementioned element groups. This structure enables efficient conversion of blue light into visible light.

(2) In the aforementioned optical wavelength conversion member, when measurements corresponding to the A concentration of $(Y,A)_3B_5O_{12}$:Ce are determined at regular intervals from the periphery of a $(Y,A)_3B_5O_{12}$:Ce crystal grain toward an interior portion of the crystal grain by use of an image of the $(Y,A)_3B_5O_{12}$:Ce crystal grain obtained through EELS analysis, the average of a plurality of measurements falling within a range of ±5 with respect to the measurement at a position nearest to the periphery is defined as a standard value (100). In a region inside the region where the measurements are determined, the position at which a measurement is 60% of the standard value (100) is defined as a segregation border. In this case, the segregation border may be located inward from the periphery of a $(Y,A)_3B_5O_{12}$:Ce crystal grain by a distance equal to 1% to 25% of the grain size of the crystal grain (hereinafter the term "distance" may be omitted).

Such a difference in A concentration can achieve an optical wavelength conversion member exhibiting superior fluorescent characteristics (e.g., high emission intensity) and superior thermal characteristics (e.g., heat resistance regarding temperature quenching) with varied colors of light emitted from the optical wavelength conversion member.

When the segregation border is located inward from the periphery of the crystal grain by a distance less than 1% of the grain size, the A concentration is excessively high at the periphery of the crystal grain, and thus emission intensity and thermal characteristics may be impaired. Meanwhile, when the segregation border is located inward from the periphery of the crystal grain by a distance greater than 25% of the grain size, difficulty may be encountered in achieving a desired chromaticity, and thus emission intensity and thermal characteristics may be impaired. Therefore, most preferably, the segregation border is located in the aforementioned region (i.e., inward from the periphery of the crystal grain by a distance equal to 1% to 25% of the grain size).

A measurement corresponding to A concentration can be determined as described in the Experimental Examples hereinbelow. For example, the brightness corresponding to A concentration is determined by analyzing an image obtained through EELS analysis, and the brightness can be used as the measurement.

The aforementioned regular intervals may be intervals of 10 nm to 50 nm; for example, intervals of 30 nm.

The aforementioned segregation border may be the average of segregation borders determined in a plurality of (e.g., three or more) $(Y,A)_3B_5O_{12}$:Ce crystal grains.

The position on the periphery (i.e., the periphery of a $(Y,A)_3B_5O_{12}$:Ce crystal grain) at which the segregation border is determined may be, for example, a specific position on the interface between the $(Y,A)_3B_5O_{12}$:Ce crystal grain and a $Al_2O_3$ crystal grain. For example, the position at which the segregation border is determined may be a position on the $(Y,A)_3B_5O_{12}$:Ce crystal grain at which the distance is shortest between the area center (centroid position) in the aforementioned image and the $Al_2O_3$ crystal grain. The position of an interior portion of the $(Y,A)_3B_5O_{12}$:Ce crystal grain may be the area center (centroid position) of the crystal grain in the aforementioned image.

The aforementioned grain size is the average of the sizes of a plurality of $(Y,A)_3B_5O_{12}$:Ce crystal grains. For example, the grain size may be determined by the intercept method (e.g., determined from the grain sizes of 100 or more crystal grains, or determined by measurement in a region of the aforementioned image having a predetermined area (e.g., a region of 40 μm×30 μm)).

(3) Another aspect of the present disclosure is directed to a light-emitting device comprising the aforementioned optical wavelength conversion member and a light-emitting element.

The light (i.e., fluorescence) having a wavelength converted by means of the light-emitting device (specifically, the optical wavelength conversion member) exhibits high fluorescence intensity. The optical wavelength conversion member exhibits high heat resistance.

The light-emitting element of the light-emitting device may be any known element, such as an LED or LD.

<Characteristic Features of the Present Disclosure Will Now be Described>

The term "main component" refers to any component present in a predominant amount (i.e., volume) in the optical wavelength conversion member. For example, the optical wavelength conversion member may contain $Al_2O_3$ crystal grains as translucent grains (i.e., grains having translucency) and crystal grains represented by formula $(Y,A)_3B_5O_{12}$:Ce (i.e., $(Y,A)_3B_5O_{12}$:Ce crystal grains) as fluorescent grains (i.e., grains capable of emitting fluorescence) in a total amount of 50 vol. % or more (preferably 90 vol. % or more).

As used herein, the term "translucent grains" refers to grains having translucency, and the term "fluorescent grains" refers to grains that can emit fluorescence when irradiated with light having a predetermined wavelength.

When the total amount of $Al_2O_3$ crystal grains and $(Y,A)_3B_5O_{12}$:Ce crystal grains is 100 vol. %, the amount of $(Y,A)_3B_5O_{12}$:Ce crystal grains may be, for example, 3 vol. % to 70 vol. %.

The term "$(Y,A)_3B_5O_{12}$:Ce" refers to the case where a portion of Y and/or element A contained in $(Y,A)_3B_5O_{12}$ is substituted by Ce through formation of a solid solution. The compound having such a structure exhibits fluorescent characteristics.

The element A concentration (i.e., ion concentration) of a $(Y,A)_3B_5O_{12}$:Ce crystal grain corresponds to the amount of element A (i.e., element A ions) contained in the $(Y,A)_3B_5O_{12}$:Ce crystal grain, and can be represented by, for example, mol %.

The formula $(Y,A)_3B_5O_{12}$:Ce refers to the case where Y is an essential element, and A and B are selected from the aforementioned element A group and element B group, respectively.

Examples of the lanthanoid (except for Ce) include La, Pr, Nd, Pm, Sm, Eu, Gd, Tb, Dy, Ho, Er, Tm, Yb, and Lu.

In the ceramic sintered body, crystal grains or the grain boundary therebetween may contain an unavoidable impurity.

The amount of the compound represented by the formula $(Y,A)_3B_5O_{12}$:Ce is preferably 3 vol. % to 70 vol. % relative to the entire ceramic sintered body.

DESCRIPTION OF REFERENCE NUMERALS

1: light-emitting device
5: light-emitting element
9: optical wavelength conversion member

MODES FOR CARRYING OUT THE INVENTION

Next will be described embodiments of the optical wavelength conversion member and light-emitting device of the present disclosure.

1. Embodiment

[1-1. Light-Emitting Device]

Now will be described a light-emitting device including an optical wavelength conversion member according to the present embodiment.

Figure 1:
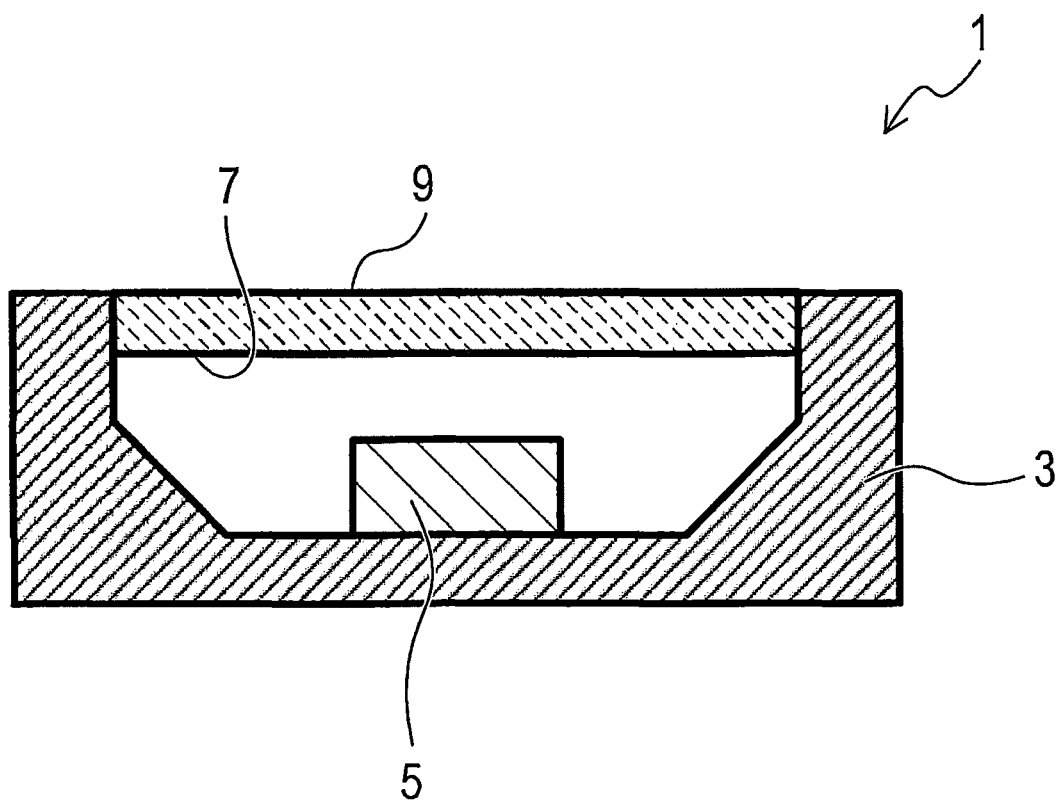
FIG. 1 Cross-sectional view (in a thickness direction) of a light-emitting device.

As illustrated in FIG. 1, a light-emitting device 1 of the first embodiment includes a box-shaped ceramic package (container) 3 formed of, for example, alumina; a light-emitting element 5 (e.g., LD) disposed in the interior of the container 3; and a plate-like optical wavelength conversion member 9 disposed so as to cover an opening 7 of the container 3.

In the light-emitting device 1, light emitted from the light-emitting element 5 transmits through the translucent optical wavelength conversion member 9, and the wavelength of a portion of the emitted light is converted in the interior of the optical wavelength conversion member 9. Thus, the optical wavelength conversion member 9 emits fluorescence having a wavelength different from that of the light emitted from the light-emitting element 5.

For example, the optical wavelength conversion member 9 converts the wavelength of blue light emitted from an LD, whereby the optical wavelength conversion member 9 as a whole emits white light to the outside (e.g., upward in FIG. 1).

[1-2. Optical Wavelength Conversion Member]

The optical wavelength conversion member 9 will next be described.

The optical wavelength conversion member 9 of the present embodiment is composed of a polycrystalline ceramic sintered body containing, as main components, $Al_2O_3$ crystal grains (i.e., translucent grains) and crystal grains represented by formula $(Y,A)_3B_5O_{12}$:Ce (i.e., $(Y,A)_3B_5O_{12}$:Ce crystal grains:fluorescent grains).

In the optical wavelength conversion member 9, each of A and B of $(Y,A)_3B_5O_{12}$:Ce is at least one element selected from the following element groups. That is, the ceramic sintered body has a so-called garnet structure.

A: lanthanoids (except for Ce) and Sc, and
B: Al and Ga.

In the optical wavelength conversion member 9, a $(Y,A)_3B_5O_{12}$:Ce crystal grain has a region wherein the A concentration (i.e., ion concentration) of a peripheral portion (in particular, a peripheral portion adjacent to an $Al_2O_3$ crystal grain) of the $(Y,A)_3B_5O_{12}$:Ce crystal grain is higher than that of an interior portion of the $(Y,A)_3B_5O_{12}$:Ce crystal grain.

Thus, a $(Y,A)_3B_5O_{12}$:Ce crystal grain exhibits a concentration gradient such that the A concentration increases from an interior portion (e.g., the center of the crystal grain) toward a peripheral portion of the crystal grain.

In the present embodiment, the border between a region of high A concentration (peripheral region) and a region of low A concentration (interior region) (hereinafter the border will be referred to as "segregation border") is located inward from the periphery of a $(Y,A)_3B_5O_{12}$:Ce crystal grain by a distance equal to 1% to 25% of the grain size of the crystal grain.

The segregation border is the average of segregation borders determined in a plurality of (e.g., five) $(Y,A)_3B_5O_{12}$:Ce crystal grains. The grain size is determined through the intercept method described below.

A and B of the formula $(Y,A)_3B_5O_{12}$:Ce correspond to elements (note: different elements) forming a substance represented by the formula $(Y,A)_3B_5O_{12}$:Ce, wherein O is oxygen and Ce is cerium. In the optical wavelength conversion member 9, the Ce concentration of $A_3B_5O_{12}$:Ce is 5 mol % or less (exclusive of 0) relative to element A.

In the optical wavelength conversion member 9, the total amount of $Al_2O_3$ crystal grains and $(Y,A)_3B_5O_{12}$:Ce crystal grains is, for example, 50 vol. % or more (preferably 90 vol. % or more, more preferably 100 vol. %); for example, 99 vol. %.

When the total amount of $Al_2O_3$ crystal grains and $(Y,A)_3B_5O_{12}$:Ce crystal grains is 100 vol. %, the amount of $(Y,A)_3B_5O_{12}$:Ce crystal grains is, for example, 3 vol. % to 70 vol. %; for example, 30 vol. %.

[1-3. Production Method for Optical Wavelength Conversion Member]

A process for producing the optical wavelength conversion member 9 will now be briefly and schematically described with reference to FIG. 2.

As detailed below in Experimental Examples, the optical wavelength conversion member 9 is produced by means of reaction sintering.

Figure 2:
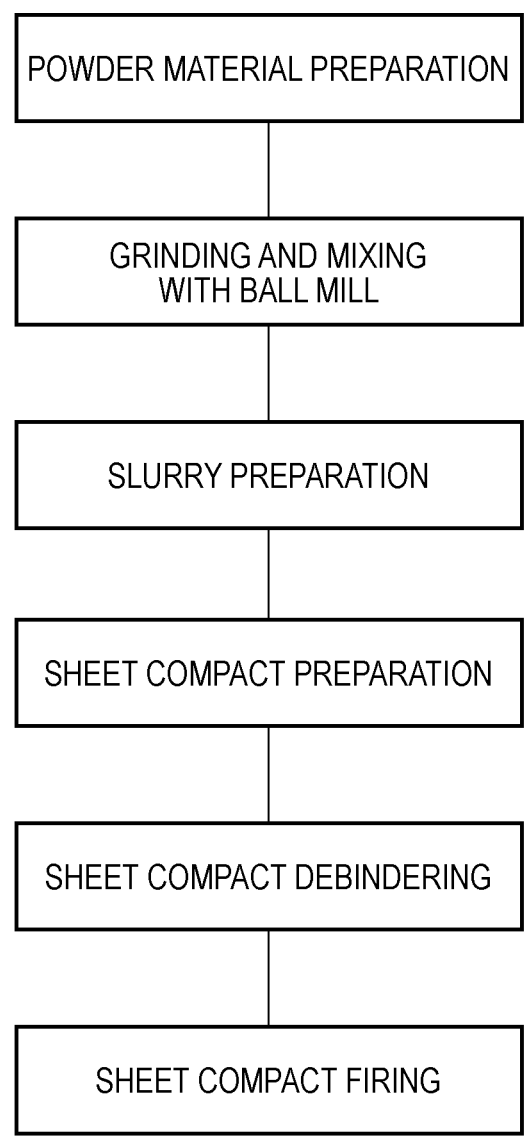
FIG. 2 Explanatory view showing a production process for an optical wavelength conversion member of an embodiment.

As illustrated in FIG. 2, powder materials for the optical wavelength conversion member 9 (i.e., ceramic sintered body) were weighed so as to satisfy the aforementioned requirement of the embodiment (i.e., the powder materials were prepared).

Subsequently, an organic solvent and a dispersant were added to the prepared powder materials, and these materials were ground and mixed in a ball mill.

Subsequently, the powder prepared through grind-mixing was mixed with a resin, to thereby prepare a slurry.

The slurry was then formed into a sheet compact through doctor blading.

The sheet compact was then debindered.

The debindered sheet compact was fired in a firing atmosphere having a pressure of 104 Pa or more and an oxygen concentration of 0.8 vol. % to 21 vol. % for a predetermined period of time. The ceramic sintered body was thereby produced.

[1-4. Effects]

The effects of the present embodiment will now be described.

(1) In the optical wavelength conversion member 9 of the present embodiment, the A concentration of a peripheral portion of the $(Y,A)_3B_5O_{12}$:Ce crystal grain is higher than that of an interior portion of the $(Y,A)_3B_5O_{12}$:Ce crystal grain. Thus, the optical wavelength conversion member 9 exhibits high fluorescence intensity (i.e., high emission intensity) and high heat resistance (i.e., low likelihood of temperature quenching).

Thus, the optical wavelength conversion member of the present embodiment has a structure wherein the element A concentration of a peripheral portion of a $(Y,A)_3B_5O_{12}$:Ce crystal grain differs from that of an interior portion of the crystal grain. This structure can achieve a ceramic fluorescent body (i.e., the optical wavelength conversion member 9) exhibiting superior fluorescent characteristics and superior thermal characteristics with varying the color of emitted light.

(2) In the present embodiment, the segregation border of element A is located inward from the periphery of a $(Y,A)_3B_5O_{12}$:Ce crystal grain by a distance equal to 1 to 25% of the grain size of the crystal grain. Thus, the compatibility between superior fluorescent characteristics and superior thermal characteristics can be achieved.

(3) In the present embodiment, the ceramic sintered body has a garnet structure represented by $(Y,A)_3B_5O_{12}$:Ce, wherein each of A and B is at least one element selected from the aforementioned element groups. This structure enables efficient conversion of blue light into visible light.

(4) The light (i.e., fluorescence) having a wavelength converted by means of the light-emitting device 1 (specifically, the optical wavelength conversion member 9) of the present embodiment exhibits high fluorescence intensity and high color uniformity.

2. Experimental Examples

Next will be described, for example, specific examples of the aforementioned embodiment.

Optical wavelength conversion member samples (Nos. 1 to 16) shown in Table 1 below were prepared.

Samples Nos. 1 to 8 and 11 to 13 fall within the scope of the present disclosure (Examples), and samples Nos. 9, 10, and 14 to 16 fall outside the scope of the present disclosure (Comparative Examples).

[2-1. Evaluation of Samples]

As described below, the samples were evaluated in terms of the following items.

<Open Porosity>

The open porosity of the ceramic sintered body of the optical wavelength conversion member of each sample was determined through the method according to JIS R1634.

<Grain Size>

The ceramic sintered body of the optical wavelength conversion member of each sample was subjected to mirror finishing, and then observed under an FESEM (field emission scanning electron microscope). In each sample, images were obtained at any five measurement points, and the grain size of $(Y,A)_3B_5O_{12}$:Ce crystal grains was determined by the intercept method. The dimensions of a region at each measurement point are, for example, 30 μm (width)×40 μm (length).

Since a plurality of $(Y,A)_3B_5O_{12}$:Ce crystal grains are observed at each measurement point, the size of each crystal grain is determined at a certain measurement point through the intercept method (so-called method of section) widely known, involving drawing of a plurality of parallel lines in an image, and the average of the sizes of a plurality of crystal grains is determined at the measurement point. The intervals of the parallel lines are, for example, 7 μm. Subsequently, the average of the sizes of crystal grains determined at each measurement point was used to calculate the average of crystal grain sizes at five measurement points. The thus-calculated value was employed as the crystal grain size.

<Measurement of Element Concentration at Periphery and Interior of Fluorescent Grain>

The ceramic sintered body of the optical wavelength conversion member of each sample was subjected to mechanical polishing, to thereby form a disk (ϕ: 3 mm, thickness: t=50 to 100 μm). Subsequently, the center of the disk was subjected to dimpling, and then a through hole was provided in the center through ion milling, to thereby prepare a sample for STEM (scanning transmission electron microscopy).

As described below, STEM observation, EELS (electron energy loss spectroscopy) mapping, and line analysis were performed at a thinnest portion around the through hole (opening) of the above-prepared sample for STEM.

(EELS Mapping)

For EELS mapping analysis, EELS spectra were collected in a single visual field (dimensions: 5 μm (width)×5 μm (length) or less) including a plurality of $(Y,A)_3B_5O_{12}$:Ce crystal grains at a resolution of 50×50 points or more (0.1 seconds for each point).

A zero loss spectrum was also collected in the same visual field, and the Gd peak intensity present at an energy loss of about 152 eV after zero position correction was shown with a two-dimensional color change, to thereby determine Gd distribution in the visual field.

Figure 3:
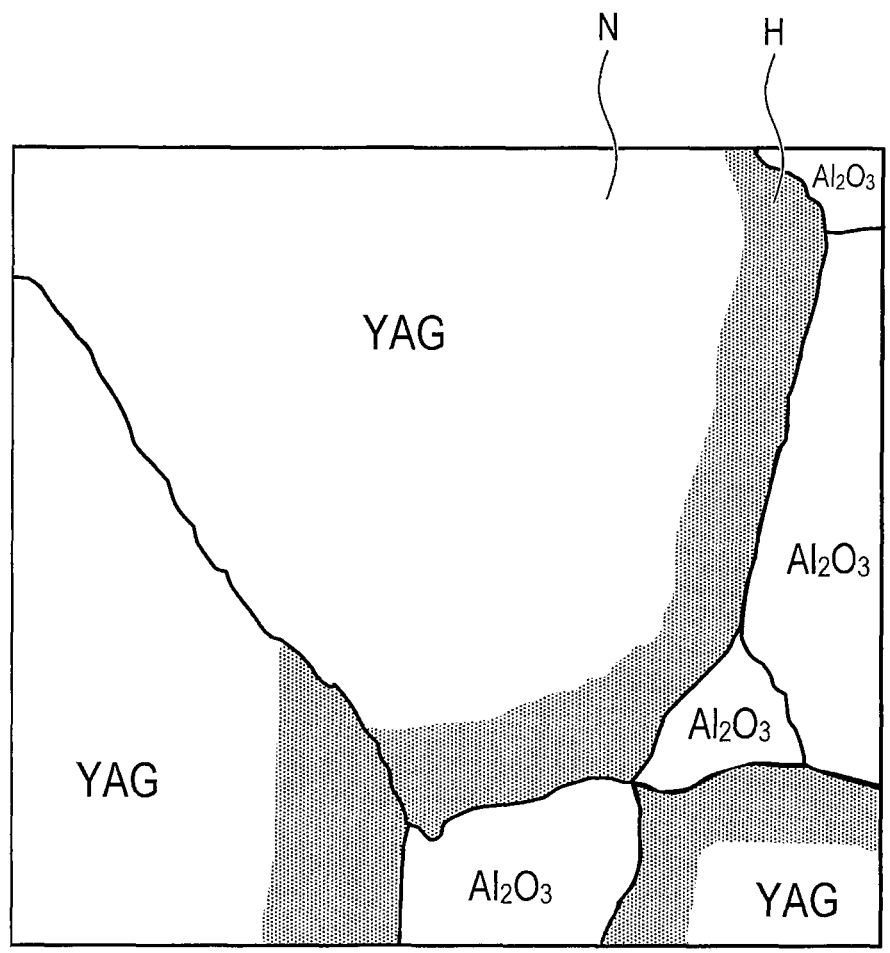
FIG. 3 Explanatory view schematically showing EELS mapping of Gd performed on an optical wavelength conversion member of Example 1.

FIG. 3 schematically shows an example of the results of this mapping (sample No. 2 of Example 1 described below). In FIG. 3, "YAG" denotes a $(Y,A)_3B_5O_{12}$:Ce crystal grain.

In FIG. 3, a black portion (i.e., a portion shown by numerous dots) along the periphery of a $(Y,A)_3B_5O_{12}$:Ce crystal grain corresponds to a peripheral portion (H) having a high Ga concentration, and a white portion inside the peripheral portion corresponds to an interior portion (N) having a Ga concentration lower than that of the peripheral portion.

(Center of Grain)

The image used in the aforementioned EELS mapping analysis was subjected to image analysis by means of image processing software (Winloof) for extraction of grain boundaries. An approximate line was drawn along the periphery of each $(Y,A)_3B_5O_{12}$:Ce crystal grain by means of the aforementioned image processing software, and the area center (centroid position) of the $(Y,A)_3B_5O_{12}$:Ce crystal grain was regarded as the center of the crystal grain.

(Line Analysis)

For line analysis, scattered electrons were captured at 100 points (1 second for 1 point) between an interior portion and the periphery of a $(Y,A)_3B_5O_{12}$:Ce crystal grain present at the edge of the opening of the sample for STEM in a direction horizontal to the opening edge (i.e., a direction in which a change in the thickness of the sample is small).

The line analysis was performed along a straight line extending from the area center (centroid position) in the image of the crystal grain within the interior portion to a peripheral portion of the crystal grain (specifically, a peripheral portion adjacent to an alumina crystal grain and nearest to the centroid position). For example, the line analysis was performed from the periphery of the crystal grain (i.e., a portion of high Gd concentration) toward the centroid position; specifically, to a region wherein the Gd peak intensity corresponding to Gd concentration was a considerably low level (e.g., 20% of the maximum Gd peak intensity). Notably, the line analysis may be performed in a direction from the interior portion toward the periphery, or in a direction from the periphery toward the interior portion.

Similar to the case of the aforementioned mapping, the Gd peak intensity was determined after zero position correction, and a change in intensity was graphically shown. The spectral intensity in the graph was used to determine a difference in the element A ion concentration between an interior portion and the periphery (e.g., a peripheral portion) of a $(Y,A)_3B_5O_{12}$:Ce crystal grain.

Figure 4:
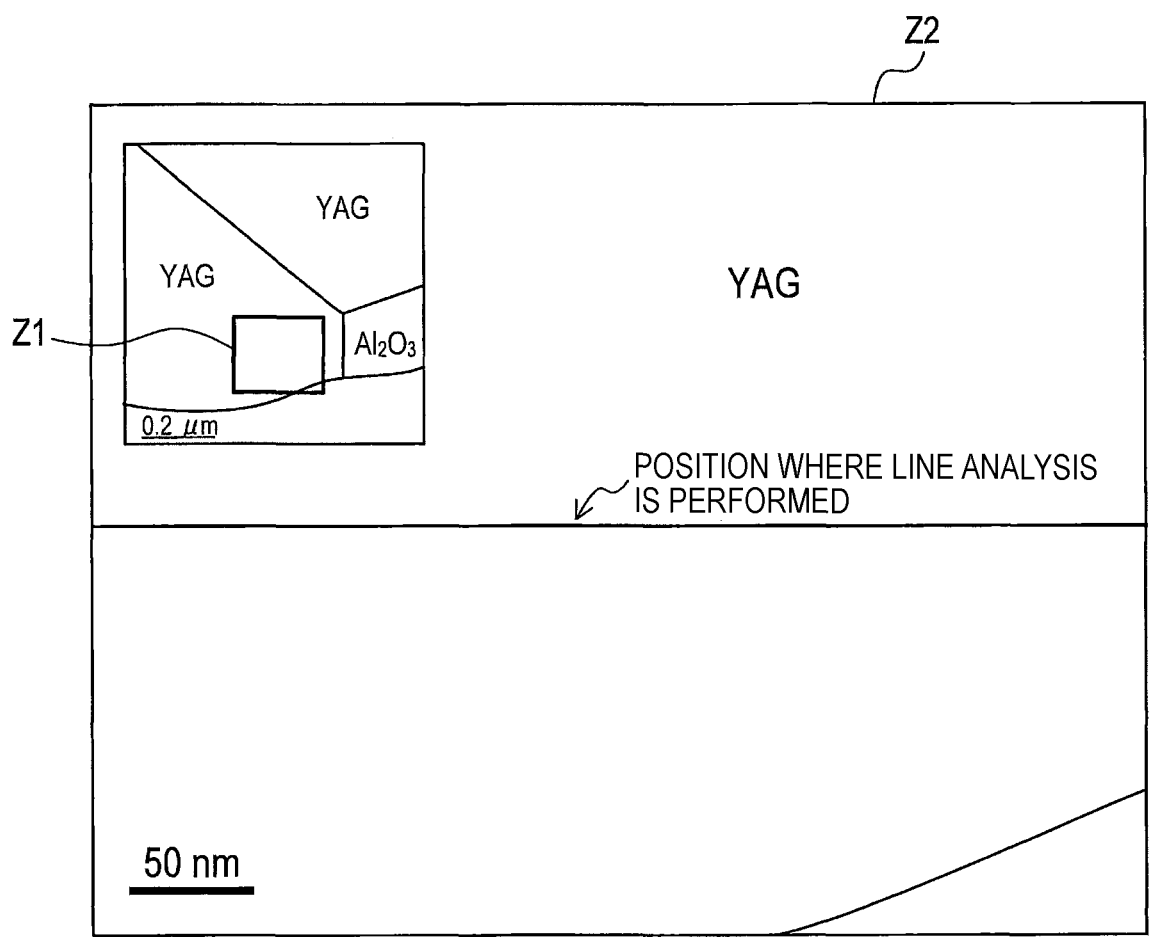
FIG. 4 Explanatory view showing a position at which line analysis is performed on the optical wavelength conversion member of Example 1.

FIG. 4 shows an example of the position where the line analysis is performed (a sample of Example 2 described below). In FIG. 4, region Z2 corresponds to an enlarged view of region Z1.

Figure 5:
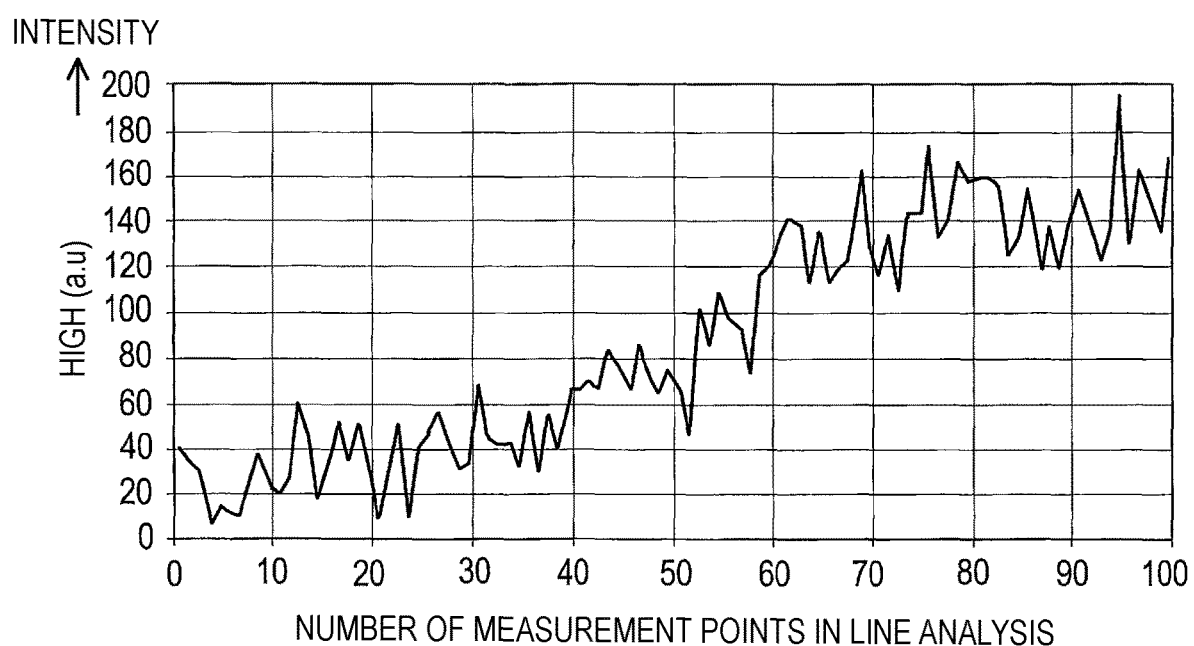
FIG. 5 Graph showing the results of line analysis performed on the optical wavelength conversion member of Example 1.

FIG. 5 is a graph showing the results of the line analysis. FIG. 5 shows Gd peak intensities at measurement points along the direction of the line analysis. Thus, the horizontal axis in FIG. 5 corresponds to positions (i.e., the number of measurement points) along the direction of the line analysis (left: interior portion, right: peripheral portion), and the vertical axis corresponds to Gd peak intensities (i.e., values corresponding to Gd concentration) at measurement points.

As shown in FIG. 5, the presence of a difference in ion concentration is determined when the element A (e.g., Gd) ion concentration (i.e., when the Gd peak intensity is higher) of a peripheral portion of a $(Y,A)_3B_5O_{12}$:Ce crystal grain is higher than that of an interior portion of the crystal grain. Specifically, the presence of a difference in ion concentration is determined when, through visual observation, the element A ion concentration of a peripheral portion of a $(Y,A)_3B_5O_{12}$:Ce crystal grain is higher than that of an interior portion of the crystal grain.

When a difference in ion concentration is present as shown in FIG. 5 (i.e., when the ion concentration is higher in a peripheral portion than in an interior portion), a regression line (linear function) of points corresponding to Gd peak intensities as determined through the widely known least-squares method exhibits a positive gradient (i.e., the intensity is higher at the peripheral portion).

<Segregation Border>

The ceramic sintered body of the optical wavelength conversion member of each sample was subjected to stamping to thereby form a disk (φ: 3 mm), and the disk was polished to have a thickness of about 50 μm. Subsequently, the center of the disk was subjected to dimpling, and then a through hole was provided in the center through ion milling, to thereby prepare a sample having a very thin portion at the edge of the through hole.

The aforementioned sample (the ceramic sintered body of the optical wavelength conversion member) was subjected to EELS mapping analysis similar to that described above, to thereby prepare an image showing Gd distribution. The image was analyzed by means of image processing software (Winloof), to thereby analyze a region of segregation of Gd (i.e., elemental Gd). This image is a monochrome image, and a portion of high Gd content is brightly shown by dots.

Specifically, a measurement region (e.g., measurement point) of 15 pixels×15 pixels was specified, and the image was binarized with a single threshold. The size of the image was adjusted so that one pixel was 4 nm. Thereafter, the concentration characteristic command represented by formula (S) described below was implemented, to thereby determine the average concentration described below.

For such a processing, brightness extraction was sequentially performed at intervals of 30 nm linearly from the periphery of a $(Y,A)_3B_5O_{12}$:Ce crystal grain toward the centroid position of the crystal grain so that adjacent measurement regions were half overlapped. The measurement was performed at 12 points (including a point where no Gd segregation was observed).

For the measurement at the periphery of a $(Y,A)_3B_5O_{12}$:Ce crystal grain, there was selected a peripheral portion adjacent to an $Al_2O_3$ crystal grain and nearest to the centroid position of the $(Y,A)_3B_5O_{12}$:Ce crystal grain.

The average brightness (i.e., average concentration=average brightness) was determined in each measurement region as described below in formula (S), and the average was regarded as the measurement corresponding to Gd concentration in the measurement region.

Average concentration (brightness)=(total of brightnesses of pixels)/the number of pixels  (S)

Figure 6:
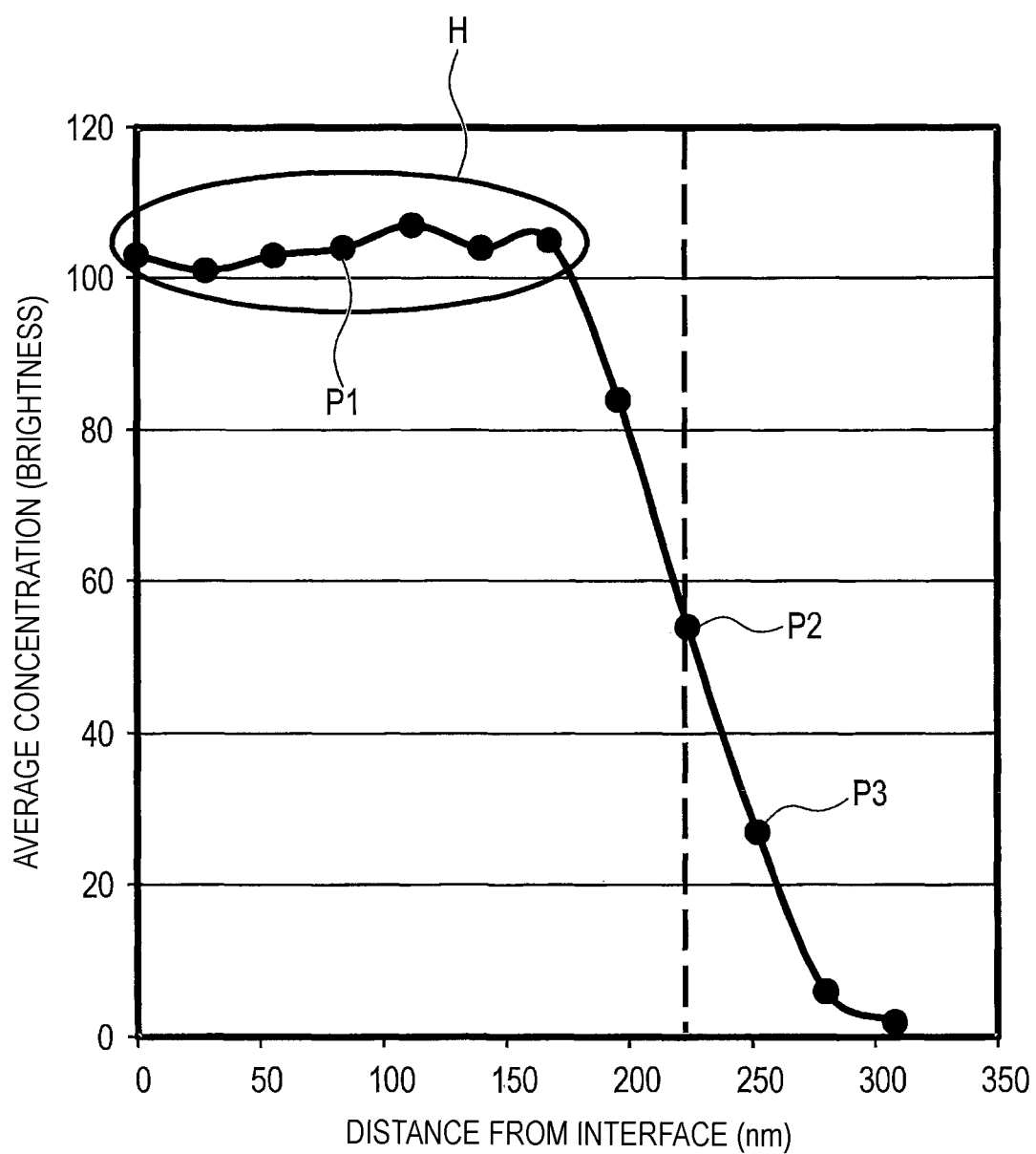
FIG. 6 Graph showing a change in measurements corresponding to Gd concentration.

As shown in FIG. 6, average concentration values falling within a range of ±5% (circled region H) with respect to the average concentration values in measurement regions at a position nearest to the periphery of the crystal grain were determined, and the average of the average concentration values falling within a range of ±5 was defined as a standard value (taken as 100%). The position at which the average concentration value was 60% with respect to the standard value (100%) was defined as a Gd segregation border. Specifically, a Gd segregation border was the position at which the average concentration value was reduced from the standard value (100%) to 60% when, as described above, the measurement was performed from the position nearest to the periphery of the crystal grain toward an interior portion of the crystal grain.

Figure 7A:
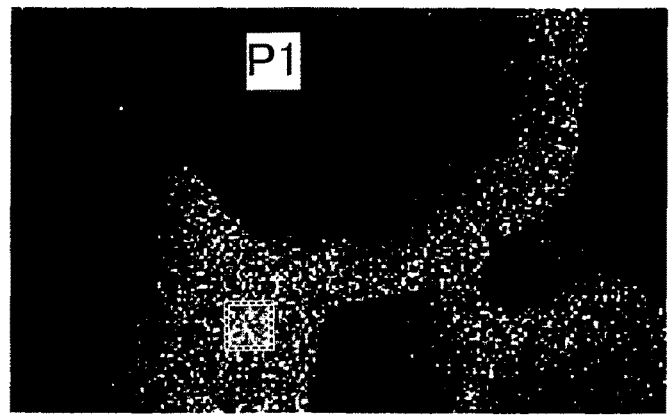
FIGS. 7A, 7B, and 7C Explanatory view showing a position at which measurements corresponding to Gd concentration are determined.
Figure 7B:
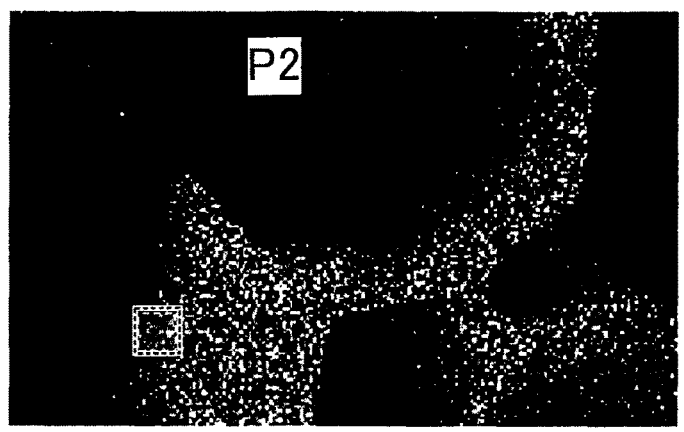
Figure 7C:

Measurement positions P1, P2, and P3 in FIG. 6 are denoted by dotted squares in FIGS. 7A, 7B, and 7C, respectively. FIG. 7 shows images obtained through the aforementioned binarization.

The aforementioned segregation border was the average of segregation borders determined in a plurality of (e.g., five) $(Y,A)_3B_5O_{12}$:Ce crystal grains.

The location of the segregation border inward from the periphery of the crystal grain by X % of the grain size of the crystal grain was determined. The results are shown in Table 2 below.

<Emission Intensity>

Optical wavelength conversion member samples (dimensions: 13 mm in width×13 mm in length×0.2 mm in thickness) were prepared.

Blue LD light (i.e., laser light) having a wavelength of 465 nm was focused to a width of 0.15 mm by means of a lens, and the sample was irradiated with the focused light. Light transmitted through the sample was focused with a lens, and the emission intensity was measured by means of a powder sensor. The sample was irradiated with the light at a laser power density of 40 $W/mm^2$.

The emission intensity of each sample was evaluated by a value relative to the emission intensity (taken as 100) in the case where a single-crystal body (i.e., a YAG:Ce single-crystal body) was used. The results are shown in the column "emission intensity" of Table 2. Specifically, a sample exhibiting an emission intensity of 120 or more was evaluated as "Good"; a sample exhibiting an emission intensity of 100 or more and less than 120 was evaluated as "Fair"; and a sample exhibiting an emission intensity of less than 100 was evaluated as "Fail."

<Laser Output Tolerance>

Optical wavelength conversion member samples (dimensions: 13 mm in width×13 mm in length×0.2 mm in thickness) were prepared.

Blue LD light having a wavelength of 465 nm was focused to a width of 0.15 mm by means of a lens, and each optical wavelength conversion member sample was irradiated with the focused light. The sample was irradiated with the blue LD light at a laser power density of 0 to 50 $W/mm^2$. Light transmitted through the sample was focused with a lens, and the emission intensity was measured by means of a power sensor.

Occurrence of temperature quenching was determined when the emission intensity was reduced to 60% or less of that at a laser power density of 5 $W/mm^2$. The results are shown in the column "LD output tolerance" of Table 2. A sample exhibiting no temperature quenching at 50 $W/mm^2$ was evaluated as "Good"; a sample exhibiting temperature quenching at more than 30 $W/mm^2$ and less than 50 $W/mm^2$ was evaluated as "Fair"; and a sample exhibiting temperature quenching at 30 $W/mm^2$ or less was evaluated as "Fail." A sample exhibiting no temperature quenching at 50 $W/mm^2$ or more is preferred in terms of laser output tolerance.

<Emission Spectra>

Light obtained in the same manner as in the aforementioned measurement of <emission intensity> (i.e., light focused with a lens) was subjected to measurement of emission spectra by means of a color illuminometer. The wavelength at the highest point of the spectra was regarded as "emission peak wavelength," and the shift of emission spectra (i.e., shift from 467 nm) was evaluated. The results are shown in the column "emission peak wavelength" of Table 2.

[2-2. Production Method for Sample and Results of Evaluation]

Next will be described a production method for each sample and the results of evaluation of the sample.

Example 1

Optical wavelength conversion members (samples Nos. 1 to 8) were prepared under the conditions shown in Table 1 below. Specifically, optical wavelength conversion members (samples Nos. 1 to 8) were prepared through reaction sintering.

The dimensions of the sample are, for example, 13 mm (width)×13 mm (length)×0.2 mm (thickness).

(1) Firstly, a ceramic sintered body (fluorescent body) was prepared through the procedure described below.

Specifically, as shown in Table 1, $Al_2O_3$ powder (mean particle size: 0.2 μm), $Y_2O_3$ powder (mean particle size: 1.2 μm), $Gd_2O_3$ powder (mean particle size: 0.9 μm), and $CeO_2$ powder (mean particle size: 1.5 μm) were weighed so as to achieve the composition of the ceramic sintered body of each of samples Nos. 1 to 8.

The amount of $(Y,A)_3B_5O_{12}$:Ce was maintained constant at 30 vol. % relative to the entire ceramic sintered body.

These powder materials were added to a ball mill together with ethanol, and these materials were grind-mixed for 16 hours. The resultant slurry was dried and formed into granules. A predetermined amount (2 wt. % of total) of a completely melted binder was added to the granules, and the mixture was thoroughly stirred and dried, to thereby yield a predetermined powder.

The resultant powder was subjected to press molding and then CIP molding, to thereby prepare a compact. The compact was debindered and then fired in an air atmosphere, to thereby prepare a ceramic sintered body (i.e., optical wavelength conversion member).

During this firing, in a first step, the compact was retained at a firing temperature of 1,500° C. (lower by 1,000° C. than the firing temperature in a second step) for 0 to 8 hours, and then, in a second step, the compact was retained at a firing temperature of 1,600° C. for 10 hours.

A long retention time in the first step causes segregation of Gd toward a peripheral portion (i.e., an increase in Gd concentration at the peripheral portion), leading to approach of a segregation border toward the peripheral portion. In contrast, a short retention time in the first step suppresses segregation of Gd toward the peripheral portion, leading to approach of a segregation border toward an interior portion.

(2) The optical wavelength conversion member of each sample was evaluated by the aforementioned evaluation methods. The results of evaluation are shown in FIGS. 3 and 4 and Table 2 below.

In Table 1, the moiety corresponding to (Y,A) is represented by X, and Y and element A (Gd, Sc, or Lu) are shown in the column "X."

FIG. 3 shows the results of EELS mapping of sample No. 2. In FIG. 3, positions where Gd is present are shown by dots.

As is clear from FIG. 3, a large amount of Gd is present at the periphery (peripheral portion) of a $(Y,A)_3B_5O_{12}$:Ce crystal grain.

FIG. 4 shows a position where line analysis is performed on sample No. 2. As shown in FIG. 4, the line analysis was performed from an interior portion of a $(Y,A)_3B_5O_{12}$:Ce crystal grain toward a peripheral portion (to the periphery) of the crystal grain.

The results of the line analysis are shown in FIG. 5. As shown in FIG. 5, the Gd peak intensity increases from the left (interior portion) toward the right (peripheral portion). Specifically, a regression line (linear function) of points corresponding to Gd peak intensities as determined through the least-squares method exhibits a positive gradient (i.e., the intensity is higher at the peripheral portion).

As is clear from Table 2, samples Nos. 1 to 8, which are produced by the method (i.e., reaction sintering) described in Table 2, exhibit a difference in element A (i.e., Gd) ion concentration between interior and peripheral portions of a $(Y,A)_3B_5O_{12}$:Ce crystal grain (specifically, the Gd ion concentration is higher in the peripheral portion than in the interior portion).

Thus, samples Nos. 1 to 8 are preferred in view that they exhibit a high emission intensity of 100 or more and an LD output tolerance of more than 30 W/mm$^2$ (i.e., low likelihood of temperature quenching).

Samples Nos. 1 to 8 exhibited an open porosity of 0.01% and a relative density of 99% or more. Similar to these samples, the relative density was high in samples of Example 2 described below.

Samples Nos. 2 to 5 are preferable in view that the segregation border (i.e., a region of high Gd concentration) is located inward from the periphery of a crystal grain by a distance equal to 1% to 25% of the grain size of the crystal grain; hence these samples exhibit high emission intensity and high LD output tolerance.

In contrast, sample No. 1 exhibits emission intensity and LD output tolerance lower than those of samples Nos. 2 to 5, since the segregation border is located inward from the periphery of a crystal grain by a distance less than 1% of the grain size of the crystal grain. Samples Nos. 6 to 8 exhibit emission intensity and LED output tolerance lower than those of samples Nos. 2 to 5, since the segregation border is located inward from the periphery of a crystal grain by a distance greater than 25% of the grain size of the crystal grain.

Comparative Examples 1 and 2

Optical wavelength conversion members (samples Nos. 9 and 10) were prepared under the conditions shown in Table 1 below.

The ceramic sintered body samples of Comparative Examples 1 and 2 were prepared through a conventional mixing-system production method (see, for example, Patent Document 1).

Specifically, a fluorescent crystal powder (e.g., YAG powder) was mixed with a translucent crystal powder (e.g., Al$_2$O$_3$ powder) to thereby prepare a powder mixture material, and the powder mixture was formed into a compact. The compact was fired under the conditions shown in Table 1 below, to thereby prepare a sample.

Samples Nos. 9 and 10 were evaluated in the same manner as in Example 1. The results are shown in Table 2 below.

As is clear from Table 2, samples Nos. 9 and 10 exhibit no difference in element A (i.e., Gd) ion concentration between interior and peripheral portions of a $(Y,A)_3B_5O_{12}$:Ce crystal grain.

Thus, samples Nos. 9 and 10 are not preferable in view that they exhibit low emission intensity and an LD output tolerance of 30 W/mm$^2$ or less (i.e., high likelihood of temperature quenching).

Example 2

Optical wavelength conversion members (samples Nos. 11 to 13) were prepared under the conditions shown in Table 1 below. Specifically, optical wavelength conversion members (samples Nos. 11 to 13) were prepared through reaction sintering.

Basically, each sample was prepared through the same procedure as in Example 1. However, materials used in Example 2 are slightly different from those used in Example 1. The difference will now be described.

Specifically, Al$_2$O$_3$ powder (mean particle size: 0.2 μm), Y$_2$O$_3$ powder (mean particle size: 1.2 μm), Gd$_2$O$_3$ powder (mean particle size: 0.9 μm), Ga$_2$O$_3$ powder (mean particle size: 0.9 μm), and CeO$_2$ powder (mean particle size: 1.5 μm) were weighed so as to achieve the composition of the ceramic sintered body of sample No. 11 shown in Table 1, to thereby prepare a powder for sample No. 11.

Separately, Al$_2$O$_3$ powder (mean particle size: 0.2 μm), Y$_2$O$_3$ powder (mean particle size: 1.2 μm), Sc$_2$O$_3$ powder (mean particle size: 0.9 μm), Ga$_2$O$_3$ powder (mean particle size: 0.9 μm), and CeO$_2$ powder (mean particle size: 1.5 μm) were weighed so as to achieve the composition of the ceramic sintered body of sample No. 12 shown in Table 1, to thereby prepare a powder for sample No. 12.

Separately, Al$_2$O$_3$ powder (mean particle size: 0.2 μm), Y$_2$O$_3$ powder (mean particle size: 1.2 μm), Lu$_2$O$_3$ powder (mean particle size: 0.9 μm), Ga$_2$O$_3$ powder (mean particle size: 0.9 μm), and CeO$_2$ powder (mean particle size: 1.5 μm) were weighed so as to achieve the composition of the ceramic sintered body of sample No. 13 shown in Table 1, to thereby prepare a powder for sample No. 13.

In the same manner as in Example 1 above, samples Nos. 11 to 13 were prepared from the powders for samples No. 11 to 13, and the samples were evaluated. The results are shown in Table 2 below.

As is clear from Table 2, samples Nos. 11 to 13 exhibit a difference in element A (i.e., Gd, Sc, or Lu) ion concentration between interior and peripheral portions of a $(Y,A)_3B_5O_{12}$:Ce crystal grain (specifically, the ion element A concentration is higher in the peripheral portion than in the interior portion). The segregation border is located inward from the periphery of a crystal grain by a distance equal to 1% to 25% of the grain size of the crystal grain.

Thus, samples Nos. 11 to 13 are preferable in view that they exhibit a high emission intensity of 100 or more and an LD output tolerance of more than 50 W/mm$^2$ (i.e., low likelihood of temperature quenching).

Comparative Example 3

Optical wavelength conversion members (samples Nos. 14 to 16) were prepared under the conditions shown in Table 1 below.

The ceramic sintered body samples of Comparative Example 3 were prepared in a mixing-system production method similar to that used in Comparative Examples 1 and 2.

Specifically, in sample No. 14, $(Y,Gd)_3(Al,Ga)_5O_{12}$ powder (i.e., fluorescent crystal powder) was used as a material. In sample No. 15, $(Y,Sc)_3(Al,Ga)_5O_{12}$ powder (i.e., fluorescent crystal powder) was used as a material. In sample No.

16, $(Y,Lu)_3(Al,Ga)_5O_{12}$ powder (i.e., fluorescent crystal powder) was used as a material.

Materials for each sample were mixed together to thereby prepare a mixed material for the sample. Subsequently, the mixed material was formed into a compact, and the compact was fired under the conditions shown in Table 1 below, to thereby prepare a sample.

Samples Nos. 14 to 16 were evaluated in the same manner as in Example 1. The results are shown in Table 2 below.

As is clear from Table 2, samples Nos. 14 to 16 exhibit no difference in element A (i.e., Gd) ion concentration between interior and peripheral portions of a $(Y,A)_3B_5O_{12}$:Ce crystal grain.

Thus, samples Nos. 14 to 16 are not preferable in view that they exhibit low emission intensity and an LD output tolerance of 50 W/mm$^2$ or less (i.e., high likelihood of temperature quenching).

TABLE 1

| No. | Example | X | B | $Al_2O_3$ content (vol %) | $X_3B_5O_{12}$:Ce content (vol %) | Ion other than Y in X | Amount of ion other than Y in X (mol %) | Ion other than Al in B | Amount of ion other than Al in B (mol %) | Ce content (mol %) |
|---|---|---|---|---|---|---|---|---|---|---|
| 1 | Example 1 | Y, Gd | Al | 70 | 30 | Gd | 15 | No addition | | 0.3 |
| 2 | | Y, Gd | Al | 70 | 30 | Gd | 15 | No addition | | 0.3 |
| 3 | | Y, Gd | Al | 70 | 30 | Gd | 15 | No addition | | 0.3 |
| 4 | | Y, Gd | Al | 70 | 30 | Gd | 15 | No addition | | 0.3 |
| 5 | | Y, Gd | Al | 70 | 30 | Gd | 15 | No addition | | 0.3 |
| 6 | | Y, Gd | Al | 70 | 30 | Gd | 15 | No addition | | 0.3 |
| 7 | | Y, Gd | Al | 70 | 30 | Gd | 15 | No addition | | 0.3 |
| 8 | | Y, Gd | Al | 70 | 30 | Gd | 15 | No addition | | 0.3 |
| 9 | Comparative Example 1 | Y, Gd | Al | 70 | 30 | Gd | 15 | No addition | | 0.3 |
| 10 | Comparative Example 2 | Y, Gd | Al | 70 | 30 | Gd | 20 | No addition | | 0.3 |
| 11 | Example 2 | Y, Gd | Al, Ga | 70 | 30 | Gd | 15 | Ga | 15 | 0.3 |
| 12 | | Y, Sc | Al, Ga | 70 | 30 | Sc | 15 | Ga | 15 | 0.3 |
| 13 | | Y, Lu | Al, Ga | 70 | 30 | Lu | 15 | Ga | 15 | 0.3 |
| 14 | Comparative Example 3 | Y, Gd | Al, Ga | 70 | 30 | Gd | 15 | Ga | 15 | 0.3 |
| 15 | | Y, Sc | Al, Ga | 70 | 30 | Sc | 15 | Ga | 15 | 0.3 |
| 16 | | Y, Lu | Al, Ga | 70 | 30 | Lu | 15 | Ga | 15 | 0.3 |

TABLE 2

| No. | Example | Production method | First step firing temperature (° C.) | First step retention time (hr) | Second step firing temperature (° C.) | Second step retention time (hr) | Open porosity (%) |
|---|---|---|---|---|---|---|---|
| 1 | Example 1 | Reaction sintering | 1500 | 8 | 1600 | 10 | 0.01 |
| 2 | | | 1500 | 4 | 1600 | 10 | 0.01 |
| 3 | | | 1500 | 2 | 1600 | 10 | 0.01 |
| 4 | | | 1500 | 1 | 1600 | 10 | 0.01 |
| 5 | | | 1500 | 0.5 | 1600 | 10 | 0.01 |
| 6 | | | 1500 | 0.25 | 1600 | 10 | 0.01 |
| 7 | | | 1500 | 0.125 | 1600 | 10 | 0.01 |
| 8 | | | 1500 | 0 | 1600 | 10 | 0.01 |
| 9 | Comparative Example 1 | Mixing system | 1500 | 1 | 1600 | 10 | 2 |
| 10 | Comparative Example 2 | Mixing system | 1500 | 1 | 1600 | 10 | 2.1 |
| 11 | Example 2 | Reaction sintering | 1500 | 1 | 1600 | 10 | 0.01 |
| 12 | | | 1500 | 1 | 1600 | 10 | 0.02 |
| 13 | | | 1500 | 1 | 1600 | 10 | 0.01 |
| 14 | Comparative Example 3 | Mixing system | 1500 | 1 | 1600 | 10 | 1.9 |
| 15 | | | 1500 | 1 | 1600 | 10 | 1.8 |
| 16 | | | 1500 | 1 | 1600 | 10 | 2.1 |

| No. | Ion concentration difference | Particle size (μm) | Segregation border (%) | Emission intensity | LD output tolerance (W/mm$^2$) | Emission peak wavelength (nm) |
|---|---|---|---|---|---|---|
| 1 | Yes | 42 | 0.5 | Fair | Fair | 568 |
| 2 | Yes | 3.7 | 1 | Good | Good | 568 |
| 3 | Yes | 3.3 | 5 | Good | Good | 568 |
| 4 | Yes | 3.1 | 10 | Good | Good | 568 |
| 5 | Yes | 2.7 | 25 | Good | Good | 555 |
| 6 | Yes | 2.5 | 30 | Fair | Fair | 552 |
| 7 | Yes | 2.1 | 50 | Fair | Fair | 551 |
| 8 | Yes | 1.2 | 90 | Fair | Fair | 549 |
| 9 | No | 2.5 | 0 | Fail | Fail | 560 |
| 10 | No | 3.1 | 0 | Fail | Fail | 568 |
| 11 | Yes | 2.7 | 10 | Good | Good | 560 |
| 12 | Yes | 2.5 | 10 | Good | Good | 558 |
| 13 | Yes | 2.6 | 9 | Good | Good | 545 |
| 14 | No | 2.5 | 0 | Fail | Fail | 550 |

TABLE 2-continued

| | | | | | | |
|---|---|---|---|---|---|---|
| 15 | No | 3.1 | 0 | Fail | Fail | 550 |
| 16 | No | 3.2 | 0 | Fail | Fail | 553 |

3. Other Embodiments

Needless to say, the present disclosure is not limited to the aforementioned embodiments, but may be implemented in various other forms without departing from the scope of the disclosure.

(1) For example, a sample was prepared through firing in air in the Examples described above. However, a sample having the same performance as that of the Examples can be prepared through another firing technique, such as hot press firing, vacuum firing, firing in a reductive atmosphere, HIP, or any combination of these.

(2) The aforementioned optical wavelength conversion member or light-emitting device can be used for various applications, including fluorescent bodies, optical wavelength conversion apparatuses, head lamps, lighting apparatuses, and optical apparatuses (e.g., projectors).

(3) No particular limitation is imposed on the light-emitting element used in the light-emitting device. The light-emitting element may be any known element, such as an LED or LD.

(4) In the aforementioned embodiments, the function of a single component may be shared by a plurality of components, or a single component may exert the functions of a plurality of components. Some of the components in the aforementioned embodiments may be omitted. At least some of the components in the aforementioned embodiments may be, for example, added to or replaced with components in another embodiment. Embodiments of the present disclosure encompass any form included in technical ideas specified by the appended claims.

What is claimed is:

1. An optical wavelength conversion member comprising a polycrystalline ceramic sintered body containing, as main components, $Al_2O_3$ crystal grains and crystal grains represented by formula $(Y,A)_3B_5O_{12}$:Ce, wherein
   each of A and B of $(YA)_3B_5O_{12}$:Ce is at least one element selected from the following element groups:
   A: lanthanoids (except for CO and Sc, and
   B: Al and Ga; and
   any of the $(Y,A)_3B_5O_{12}$: Ce crystal grains has a region wherein the concentration of the element A of a peripheral portion of the $(YA)_3B_5O_{12}$:Ce crystal grain is higher than that of an interior portion of the $(YA)_3B_5O_{12}$:Ce crystal grain.

2. An optical wavelength conversion member according to claim 1, wherein, in the case in which measurements corresponding to the A concentration of $(Y,A)_3B_5O_{12}$:Ce are determined at regular intervals from the periphery of a $(Y,A)_3B_5O_{12}$:Ce crystal grain toward an interior portion of the crystal grain by use of an image of the $(Y,A)_3B_5O_{12}$:Ce crystal grain obtained through EELS analysis,
   the average of a plurality of measurements falling within a range of ±5% with respect to the measurement at a position nearest to the periphery is defined as a standard value (100%), and in a region inside the region where the measurements are determined, the position at which a measurement is 60% of the standard value (100%) is defined as a segregation border of the element A, wherein
   the segregation border is located inward from the periphery of a $(Y,A)_3B_5O_{12}$:Ce crystal grain by a distance equal to 1% to 25% of the grain size of the crystal grain.

3. A light-emitting device comprising an optical wavelength conversion member as recited in claim 2 and a light-emitting element.

4. A light-emitting device comprising an optical wavelength conversion member as recited in claim 1 and a light-emitting element.

* * * * *